(12) United States Patent
Miller

(10) Patent No.: US 6,321,969 B1
(45) Date of Patent: Nov. 27, 2001

(54) EFFICIENT ENERGY TRANSFER CAPILLARY

(75) Inventor: Amir Miller, Netania (IL)

(73) Assignee: Kulicke & Soffa Investments, Wilmington, DE (US)

( * ) Notice: Subject to any disclaimer, the term of this patent is extended or adjusted under 35 U.S.C. 154(b) by 0 days.

(21) Appl. No.: 09/561,304

(22) Filed: Apr. 28, 2000

(51) Int. Cl.[7] .............................. B23K 37/00; B23K 1/06
(52) U.S. Cl. .............................................. 228/4.5; 228/1.1
(58) Field of Search ........................... 228/4.5, 1.1, 904; 219/56.5

(56) References Cited

U.S. PATENT DOCUMENTS

| | | | |
|---|---|---|---|
| 3,894,671 | * 7/1975 | Kulicke, Jr. et al. | 228/4.5 |
| 3,917,148 | * 11/1975 | Runyon | 228/54 |
| 4,315,128 | * 2/1982 | Matcovich et al. | 219/85 D |
| 4,513,190 | * 4/1985 | Ellett et al. | 219/56.21 |
| 5,377,894 | * 1/1995 | Mizoguchi et al. | 228/1.1 |
| 5,558,270 | * 9/1996 | Nachon et al. | 228/180.5 |
| 5,890,643 | * 4/1999 | Razon et al. | 228/1.1 |
| 5,971,248 | * 10/1999 | Koduri | 228/4.5 |
| 6,006,977 | * 12/1999 | Koduri | 228/4.5 |
| 6,073,827 | * 6/2000 | Razon et al. | 228/4.5 |
| 6,112,972 | * 9/2000 | Koduri | 228/180.5 |

OTHER PUBLICATIONS

F. Osterwald et al., *Increasing Bond Quality by Ultrasonic Vibration Monitoring*, ISHM—Preceedings of SPIE—The International Society for Optical Engineering (Oct. 1996), pp. 426–431.

A. Wilson et al, *Holographic Interferometry Applied to Motion Studies of Ultrasonic Bonders*, IEEE Transaction on Sonics and Ultrasonics, New York, Institute of Electrical and Electronic Engineers (1972), SU–19 (4), pp. 453–461.

\* cited by examiner

Primary Examiner—Tom Dunn
Assistant Examiner—Zidia Pittman
(74) Attorney, Agent, or Firm—Ratner & Prestia

(57) ABSTRACT

A bonding tool for bonding a fine wire to a substrate. The bonding tool comprises a first cylindrical section having a first diameter; a second cylindrical section coupled to an end of the first cylindrical section, the second cylindrical section having a second diameter less than the first diameter; and a tapered section coupled to an end of the second cylindrical section.

30 Claims, 12 Drawing Sheets

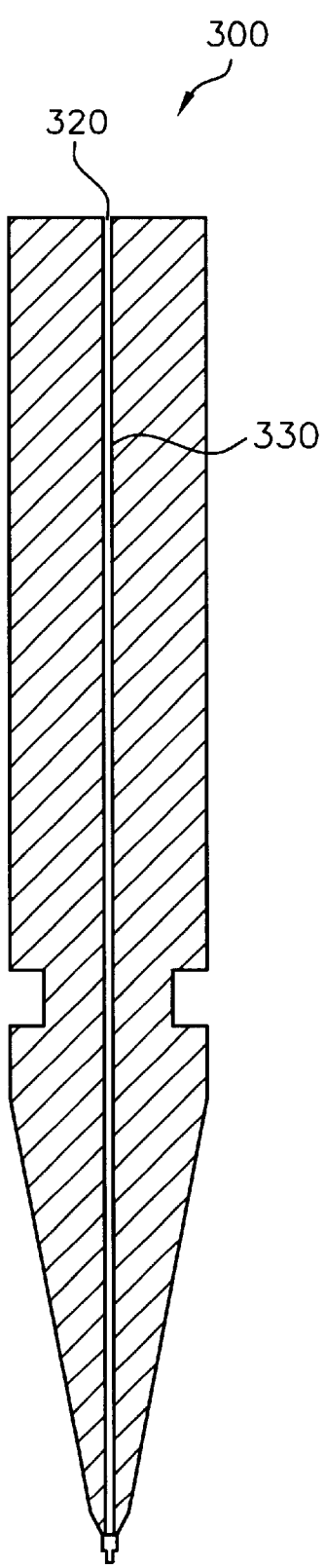
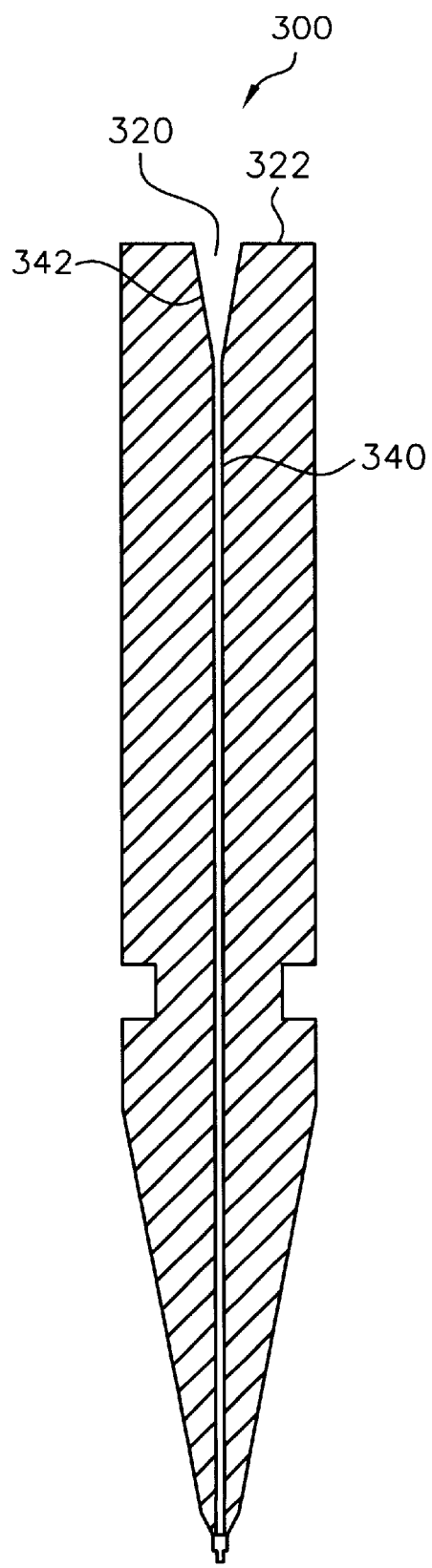
FIG. 3C    FIG. 3D

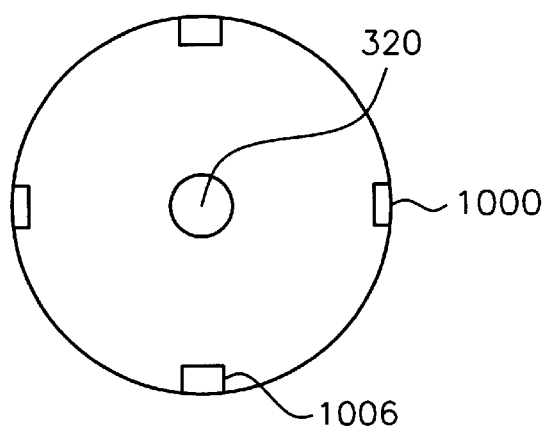
FIG. 10B
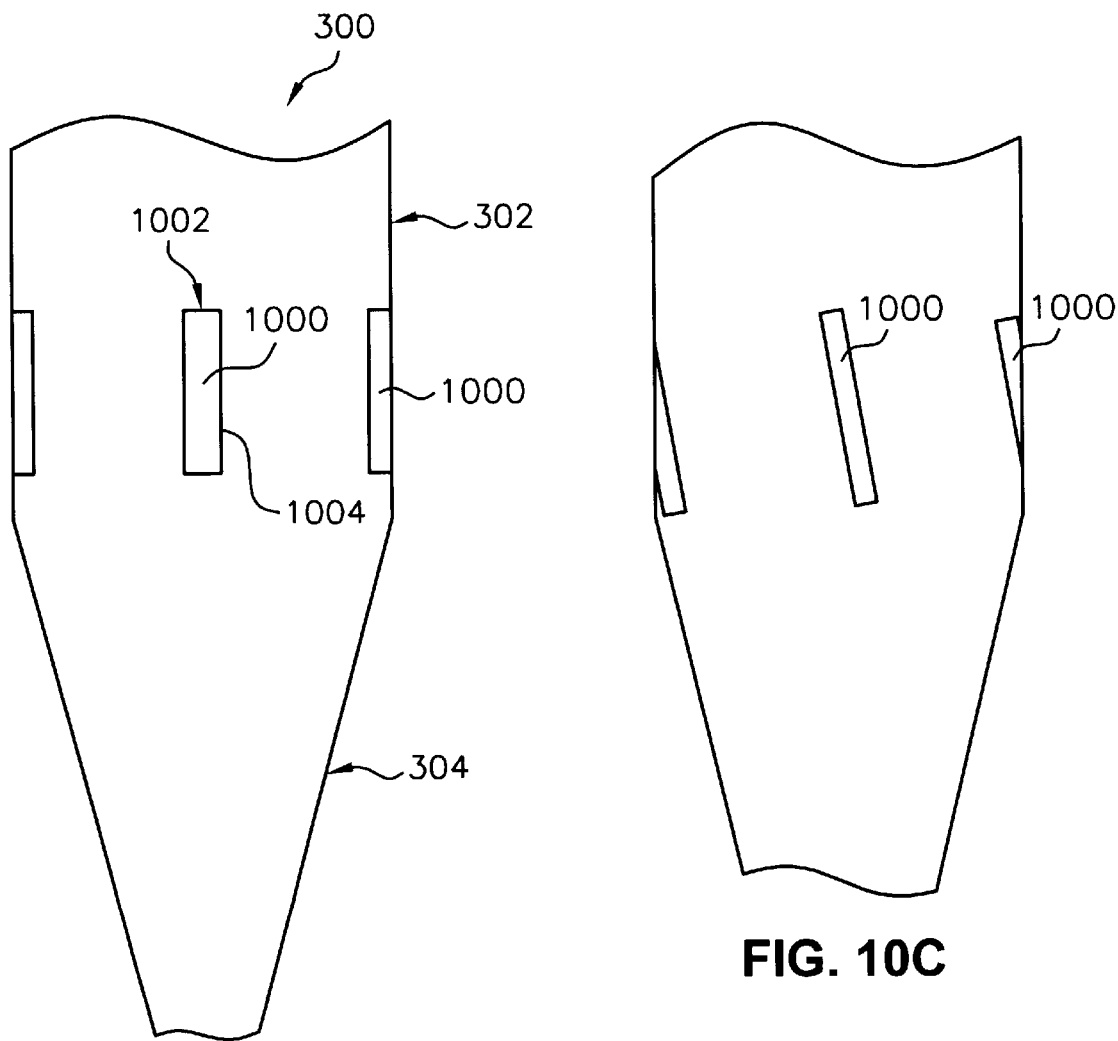
FIG. 10A
FIG. 10C

EFFICIENT ENERGY TRANSFER CAPILLARY

BACKGROUND OF THE INVENTION

This invention relates generally to a tool for use in the bonding of wire to semiconductor devices and, more particularly to a bonding tool having efficient ultrasonic energy transfer characteristics.

DESCRIPTION OF THE RELATED ART

Modern electronic equipment relies heavily on printed circuit boards on which semiconductor chips, or integrated circuits (ICs), are mounted. The mechanical and electrical connections between the chip and the substrate have posed challenges for chip designers. Three well known techniques for interconnecting the IC to the substrate are: wire bonding, tape automated bonding (TAB) and flip-chip.

The most common of these processes is wire bonding. In wire bonding, a plurality of bonding pads are located in a pattern on the top surface of the substrate, with the chip mounted in the center of the pattern of bonding pads, and the top surface of the chip facing away from the top surface of the substrate. Fine wires (which may be aluminum or gold wires) are connected between the contacts on the top surface of the chip and the contacts on the top surface of the substrate. Particularly, the connecting wires are supplied and bonded to the chip and to the substrate through a capillary, a bonding tool further described below.

Capillaries are used for ball bonding the wire to electronic devices, particularly to bond pads of semiconductor devices. Such capillaries are generally formed from a ceramic material, principally aluminum oxide, tungsten carbide, ruby, zircon toughened alumina (ZTA), alumina toughened zircon (ATZ) and other materials. Very thin wire, generally on the order of about one mil gold, copper or aluminum wire, is threaded through an axial passage in the capillary with a small ball being formed at the end of the wire, the ball being disposed external of the capillary tip. The initial object is to bond the ball to a pad on the semiconductor device and then to bond a portion farther along the wire to a lead frame or the like. During the bonding cycle, the capillaries perform more than one function.

After the ball is formed, the capillary must first center the ball partly within the capillary for bond pad targeting. With a first bonding step, the ball is bonded to a pad on a semiconductor device. When the capillary touches the ball down on the bond pad, the ball will be squashed and flatten out. As the bond pads are generally made from aluminum, a thin oxide forms on the surface of the bond pad. In order to form a proper bond, it is preferable to break the oxide surface and expose the aluminum surface. An effective way of breaking the oxide is to "scrub" the surface of the oxide with the wire ball. The wire ball is placed on the surface of the aluminum oxide and the capillary rapidly moves in a linear direction based on the expansion and contraction of a piezo-electric element placed within the ultrasonic horn to which the capillary is attached. The rapid motion, in addition to heat applied through the bond pad, forms an effective bond by transferring molecules between the wire and the bond pad.

The capillary then handles the wire during looping, smoothly feeding the bond wire both out of the capillary and then back into the capillary. The capillary then forms a "stitch" bond and a "tack" or "tail" bond.

Presently, thermosonic wire bonding is the process of choice for the interconnection of semiconductor devices to their supporting substrates. The thermosonic bonding process is partially dependent upon the transfer of ultrasonic energy from the transducer, attached to a movable bondhead, through a tool, e.g. capillary or wedge, to the ball or wire being welded to the semiconducting device or supporting substrate.

In conventional capillaries (bonding tools), the geometry of the bonding tool is not engineered to modify energy transfer to the ball/wire interconnection pad interfacial area. The inventor of the present invention has determined that control of the ultrasonic attenuation of the stress/strain wave imposed upon the tool due to the ultrasonic transducer is crucial to controlling the bonding process and its performance.

Conventional bonding tool design is deficient, however, because conventional bonding tool design is based on interconnection pitch and wire bond loop height and does not consider controlling ultrasonic attenuation. As such, conventional bonding tools are not energy efficient.

FIG. 1 is an illustration of a conventional bonding tool. As shown in FIG. 1, bonding tool 100 has a cylindrical body portion 102 and a tapered portion 104. An axial passage 108 extends from the end 110 to the tip 106 of the bonding tool 100. A bonding wire (not shown) passes through axial passage 108 and through tip 106 for eventual bonding on a substrate (not shown).

SUMMARY OF THE INVENTION

To solve the aforementioned disadvantages of conventional bonding tools, the present invention relates to an energy efficient bonding tool for bonding a fine wire to a substrate.

The bonding tool comprises a first cylindrical section having a first diameter; a second cylindrical section coupled to an end of the first cylindrical section, the second cylindrical section having a second diameter less than the first diameter; and a tapered section coupled to an end of the second cylindrical section.

According to one aspect of the present invention, the second cylindrical section is a groove.

According to another aspect of the present invention, the second cylindrical section is a plurality of grooves.

According to a further aspect of the present invention, the grooves have a substantially rectangular cross section.

According to another aspect of the present invention, the groove is replaced by a slot.

According to yet another aspect of the present invention, the tapered section is immediately adjacent the second cylindrical section.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures:

FIGS. 3A–3D are various views of a bonding tool according to exemplary embodiments of the present invention;

FIGS. 10A–10C are various views of a bonding tool according to a fourth exemplary embodiment of the present invention.

DETAILED DESCRIPTION

The present invention overcomes the deficiencies of conventional capillary bonding tools by varying the mass distribution along the length of the bonding tool. The resultant bonding tool requires less ultrasonic energy to form a bond on a substrate when compared to conventional bonding tools.

The design of ultrasonic bonding tools may be accomplished by mathematically describing the motion of the tool driven by an ultrasonic transducer. Such a system is represented by a cantilever beam as shown in equation (1):

$$\frac{\partial^2}{\partial z^2}\left[EI(z)\frac{\partial^2 x(z,t)}{\partial z^2}\right] + m(z)\frac{\partial^2 x(z,t)}{\partial t^2} = -m(z)\frac{\partial^2 x_o(t)}{\partial t^2}$$

Where E is the elastic modulus, I is the moment of inertia, m is the mass distribution, z is the distance from the moving support, x is the displacement normal to the beam and $x_o$ describes the motion of the moving support.

Figure 1:
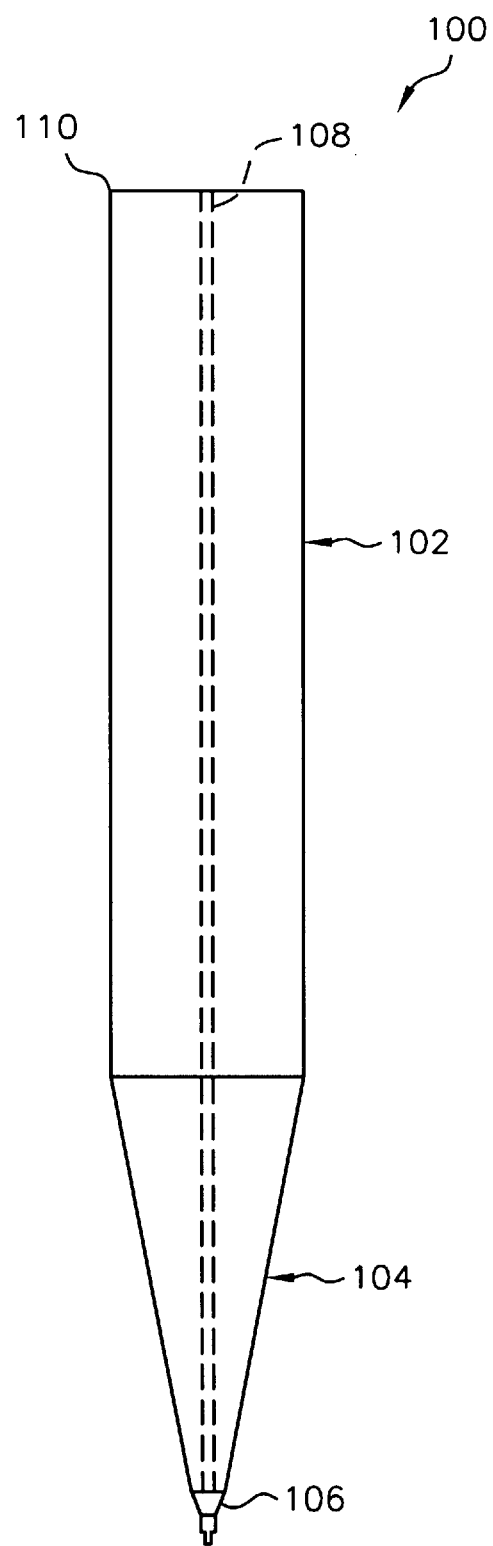
FIG. 1 is a side view of a conventional bonding tool.
Figure 2:
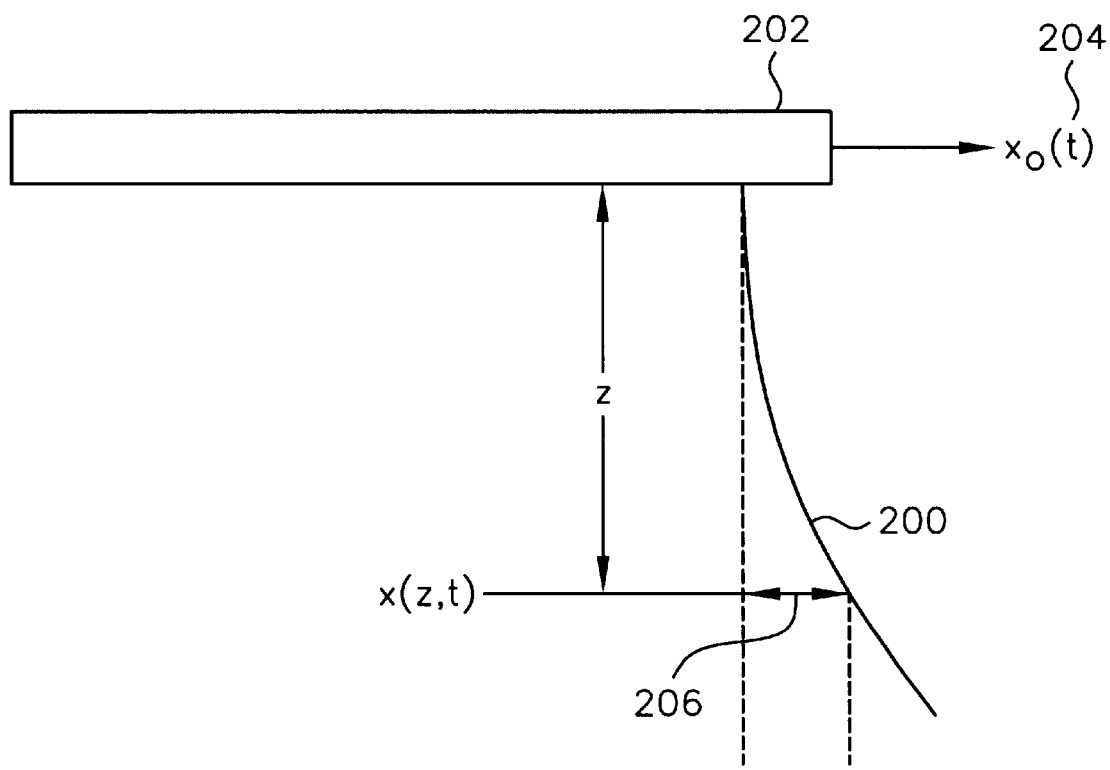
FIG. 2 is a illustration of bonding tool response with respect to transducer motion.

FIG. 2 illustrates the response of a bonding tool in accordance with equation (1). As shown in FIG. 2, for bonding tool design, the cantilever beam 200 represents the bonding tool, 204 the motion $x_o$ of the transducer 202, and 206 the bonding tool response motion x(z,t). Since the mass and moment of inertia are allowed to vary along the beam, these parameters may be used to design the composition and "shape" of a bonding tool to produce a desired bonding ultrasonic motion.

As mentioned above, in conventional designs, the moment of inertia I, and, the mass distribution m are not controlled for the purpose of ultrasonic attenuation but strictly for allowing the required interconnection pitch and wire bond loop height. In the exemplary embodiment of the present invention, the cross sectional shape and mass distribution are specified to control ultrasonic attenuation.

Several examples of the effect of engineering the Area Moment of Inertia I, and the Mass Distribution m are given. Table 1, is a summation of experimental work associated with verification of this concept with a grooved geometry with reference to FIGS. 3A–3B. The invention is not so limited, however, and it is contemplated that other geometries may be used.

TABLE 1

| Capillary | Diameter 318 ($10^{-3}$ inch) | Width 316 ($10^{-3}$ inch) | Height 314 ($10^{-3}$ inch) |
|---|---|---|---|
| A1 | 16.0 (0.406 mm) | 17.2 (0.437 mm) | 165.6 (4.206 mm) |
| A2 | 14.7 (0.373 mm) | 17.0 (0.431 mm) | 174.3 (4.427 mm) |
| A3 | 13.7 (0.348 mm) | 17.8 (0.452 mm) | 183.3 (4.656 mm) |
| H1 | 16.0 (0.406 mm) | 17.2 (0.437 mm) | 184.4 (4.683 mm) |
| H2 | 16.5 (0.419 mm) | 17.4 (0.442 mm) | 151.4 (3.845 mm) |
| H3 | 16.6 (0.422 mm) | 16.4 (0.417 mm) | 140.7 (3.573 m) |
| W1 | 15.9 (0.404 mm) | 13.6 (0.345 mm) | 161.8 (4.110 mm) |
| W2 | 15.9 (0.404 mm) | 19.3 (0.490 mm) | 164.6 (4.181 mm) |
| D1 | 11.4 (0.289 mm) | 17.4 (0.442 mm) | 165.4 (4.201 mm) |
| D2 | 8.2 (0.208 mm) | 16.9 (0.429 mm) | 165.7 (4.209 mm) |
| H1D2 | 11.5 (0.292 mm) | 17.1 (0.434 mm) | 181.9 (4.620 mm) |
| H2D2 | 8.2 (0.208 mm) | 15.6 (0.419 mm) | 149.8 (3.805 mm) |

Figure 3A:
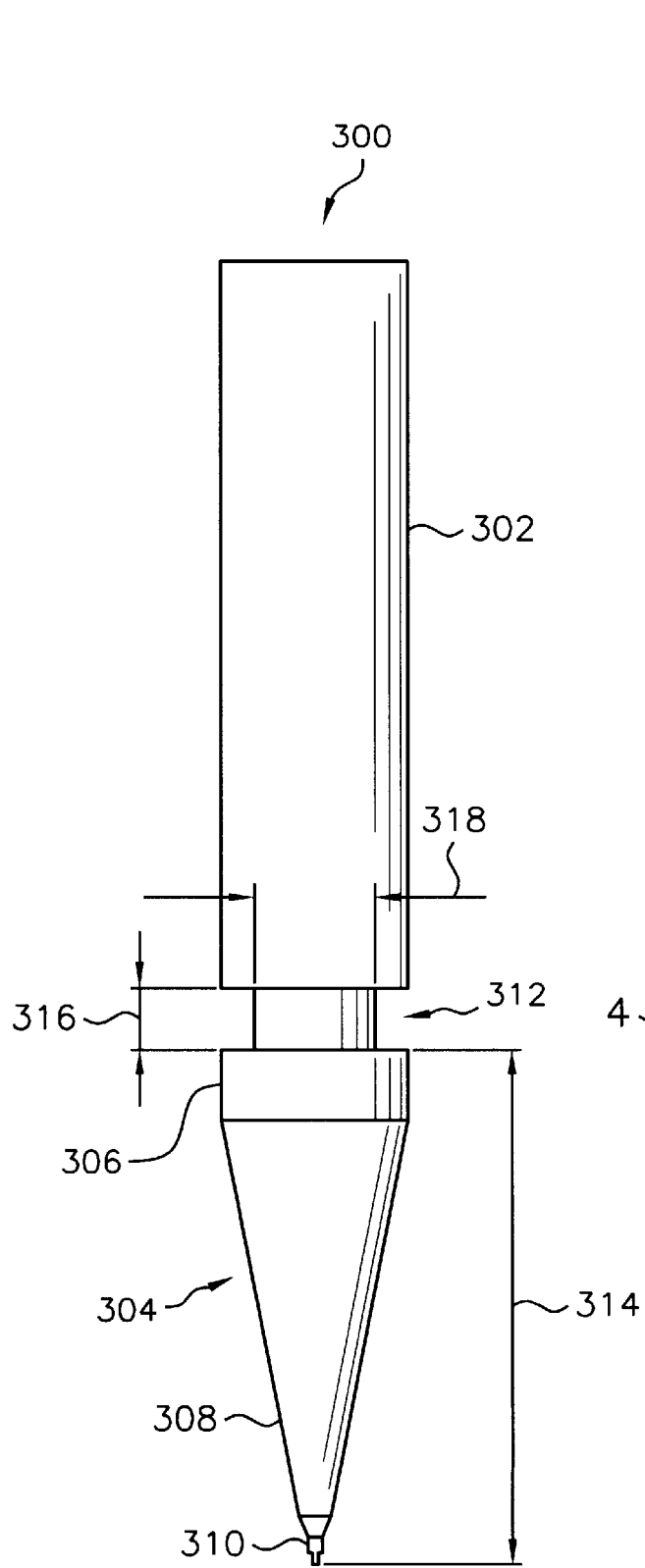

FIG. 3A is a side view of a bonding tool 300 according to a first exemplary embodiment of the present invention. As shown in FIG. 3A, bonding tool 300 has a cylindrical upper body portion 302 and a lower body portion 304. The lower body portion 304 includes a cylindrical portion 308 and a conical portion 306 that extends from the cylindrical portion 306 to the tip 310 of the bonding tool 300. Disposed between the upper body portion 302 and the lower body portion 304 is a groove 312. The groove 312 is positioned above the tip 310 at a distance 314 between about 0.1490 in. and 0.1833 in. (3.785–4.656 mm). The groove 312 is inset from the upper body portion and lower body portion such that the groove 312 has a diameter 318 of between about 0.0083 in. and 0.0155 in. (0.211–0.394 mm). The height 316 of the groove 312 is between about 0.0136 in. and 0.0200 in. (0.345–0.508 mm).

Figure 3B:
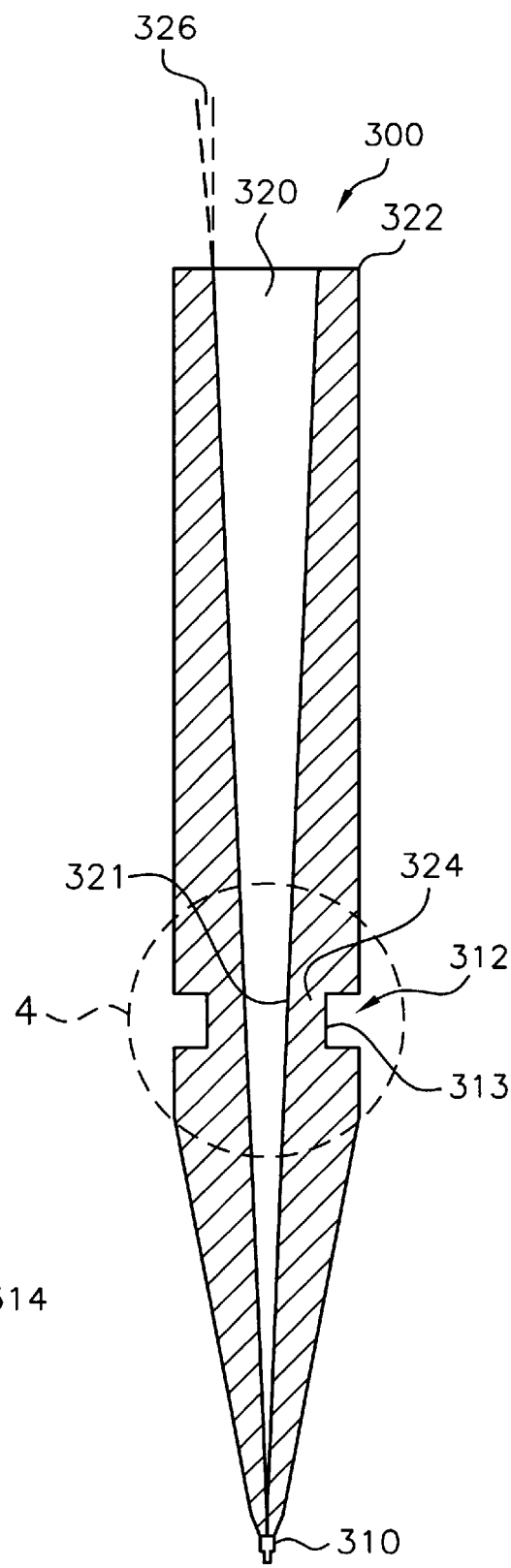

FIG. 3B is a sectional side view of bonding tool 300. As shown in FIG. 3B, an axial passage 320 extends from the end 322 to the tip 310 of bonding tool 300. In the exemplary embodiment, axial passage 320 has a substantially continuous tapered shape having a predetermined angle 326 of about 14°. The invention is not so limited, however, and it is contemplated that the axial passage 320 may be have a substantially constant diameter or tapered over only a portion of the length of bonding tool 200. The latter may be desired in order to facilitate wire insertion at the upper end 322 of bonding tool 300. Examples of such alternate axial passages are illustrated in FIGS. 3C and 3D. As shown in FIG. 3C, axial passage 320 has a substantially constant diameter 330 along the length of bonding tool 300. In FIG. 3D, bore 320 has a substantially constant diameter 340 along a portion of the length of bonding tool 300, and has a taper 342 adjacent the end 322 of bonding tool 300.

Figure 4:
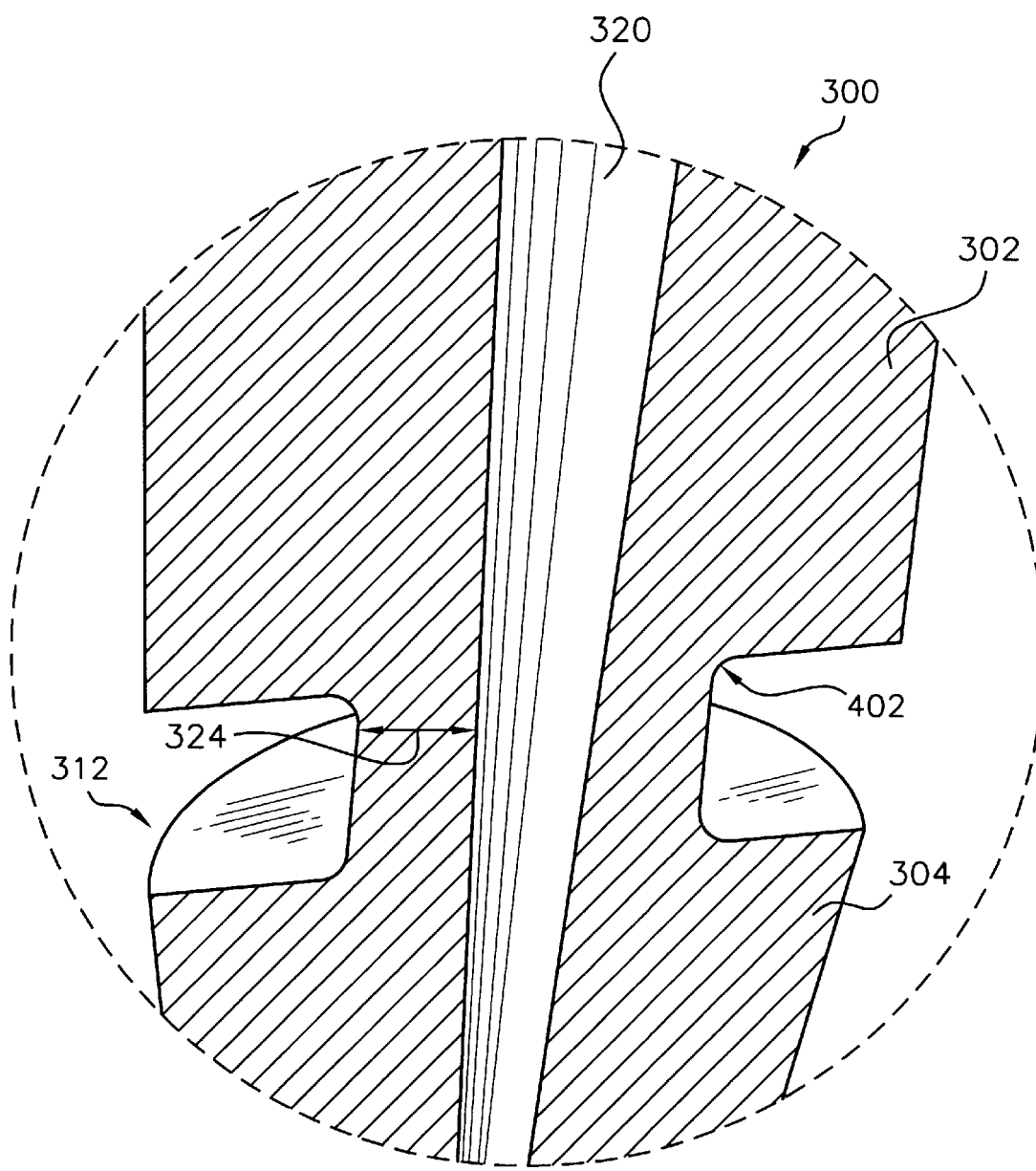
FIG. 4 is an enlarged cross sectional view of an embodiment of the present invention.

In order to maintain structural integrity of bonding tool 300, the distance between groove 312 and bore 320 must be considered during design of the bonding tool 300. The inventor refers to this distance as the "Minimum Wall Thickness" (MWT) 324. Referring now to FIG. 4, an enlarged cross section of bonding tool 300 is shown detailing MWT 324. As shown in FIG. 4, the groove 312 may have a radius 402 at an inner portion of the slot 312. This is primarily due to the profile of the device used to form groove 312. It is contemplated that the groove 312 may be formed using a blade, such as a saw blade for example. The formation of groove 312 is not so limited, and may be formed using other conventional methods, such as lathing or molding.

Referring again to FIG. 3A, in a preferred embodiment of the present invention, the distance 314 may be between about 0.140 and 0.143 in. (3.556–3.632 mm), the height 316 may be between about 0.0160 and 0.0190 in. (0.406–0.483 mm), the diameter 318 may be between about 0.0154 and 0.0160 in. (0.391–0.406 mm), and the MWT 324 is greater than 0.098 in. In the most preferred embodiment of the present invention, the distance 314 is about 0.142 in. (3.61 mm), the height 316 is about 0.0170 in. (0.432 mm), the diameter 318 is about 0.0157 in. (0.399), and the MWT 324 is about 0.0100 in. (0.254 mm).

Figure 5:
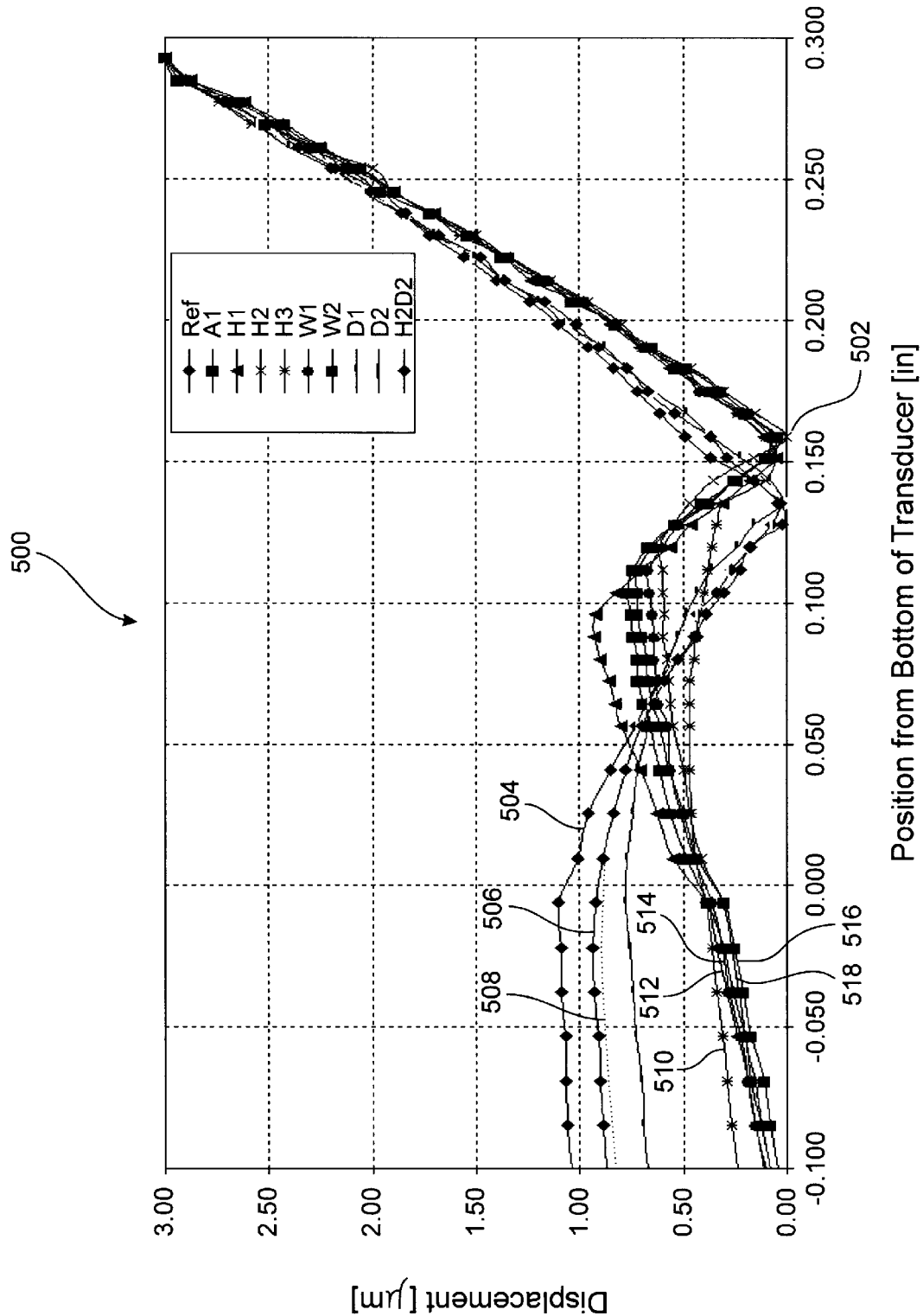
FIG. 5 is a graph plotting the effect of ultrasonic energy for a bonding tool according of the exemplary embodiment of the present invention.

Referring to FIG. 5, graph 500 is illustrated. In FIG. 5, graph 500 plots the effect of the groove 312 upon the displacement 206 (shown in FIG. 2) of the bonding tool 300 due to the imposition of an ultrasonic wave is plotted along the length of the bonding tool 300, from the transducer mount (not shown) to the free bonding end (tip 310). In FIG. 5, the ordinate is the position from the bottom of the transducer in inches and the abscissa is displacement of the bonding tool in $\mu$m. Graph 500 is plotted for a variety of bonding tools in which the position and geometry of groove 312 varies. In FIG. 5, the position of the zero displacement tool motion due to ultrasonic energy at a fixed frequency is shown as node 502. In the present invention, groove 312 in bonding tool 300 is placed at node 502. The inventor has determined that placing groove 312 at node 502 maximizes bonding tool efficiency. In FIG. 5, plot 504 illustrates the response of a conventional (reference) bonding tool, and plots 506–518 illustrate the response of bonding tools according to an exemplary embodiment of the present invention.

Figure 6:
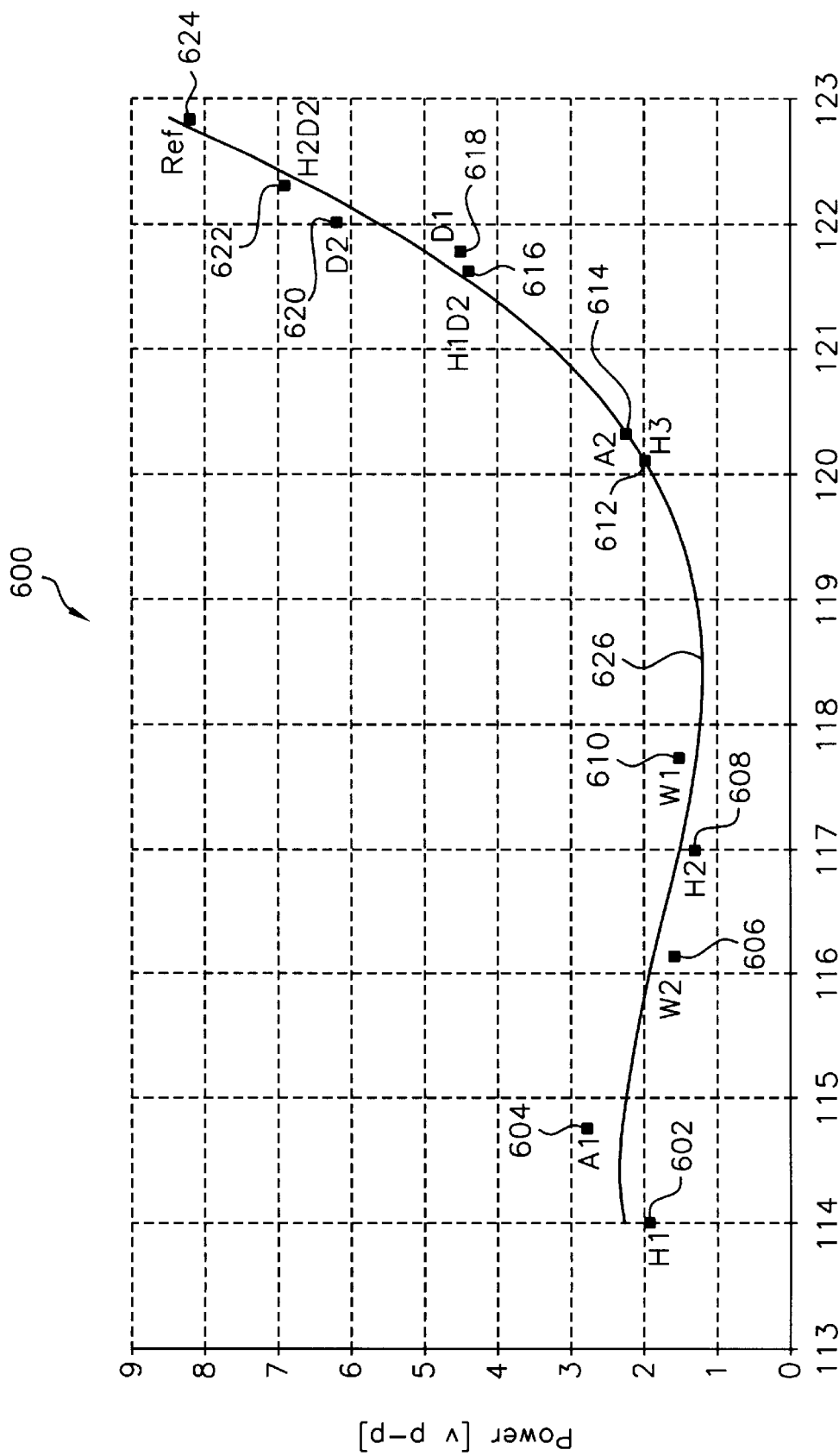
FIG. 6 is a is a graph plotting ultrasonic energy versus resonant frequency for a bonding tool according to the exemplary embodiment of the present invention.

In FIG. 6, graph 600 plots ultrasonic energy vs. frequency of resonance for a fixed tool tip displacement. In FIG. 6, resonance points 602–624 are shown and plotted as curve 626. As illustrated in FIG. 6, the point 624 represents the conventional reference tool and indicates a significantly higher energy requirement when compared to the tools according to the present invention (shown as points 602–622). Graph 600 illustrates that placement of a groove 312 in bonding tool 300 reduces the energy requirement significantly.

Figure 7:
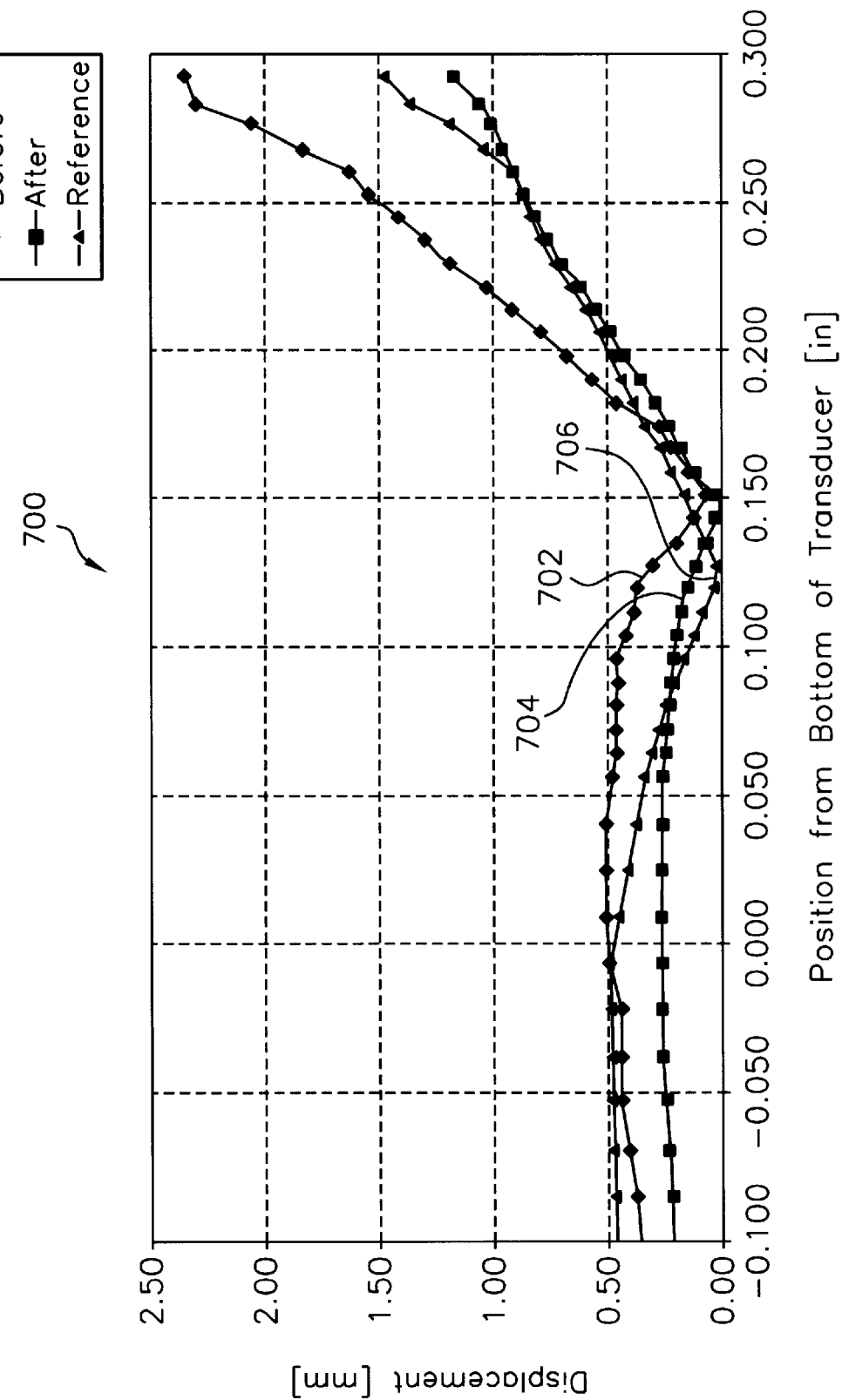
FIG. 7 is a is a is a graph plotting capillary displacement for a bonding toll according to the exemplary embodiment of the present invention.

In FIG. 7, graph 700 plots the displacement of bonding tools according to the present invention and a conventional bonding tool. As shown in FIG. 7, the displacement of a bonding tool, with its geometry optimized by control of the Area Moment of Inertia, I, by the machining of a groove, is greater than that of a standard shank (non-grooved) bonding tool. Inspection of FIG. 7 shows that, for wire bonding, the plot of tip displacement is great than that of a standard bonding tool (curve 706) both before (curve 702) and after (curve 704) use of the controlled geometry capillary according to the present invention.

The inventor has also determined that the lower energy requirement of the exemplary bonding tool results in higher quality bonds. Table 2 is a compilation of data illustrating various bonding tools, bonding (ultrasonic) energy, bonding force, and shear force required to destroy the bond. As is clearly illustrated, the exemplary bonding tool, while using less than 50% of the energy of a conventional bonding tool, provided bonds than exhibit superior shear resistance.

TABLE 2

| Capillary | Shear/UA (gr/mil$^2$) | Ball Dia. ($\mu$m) | USG (mA) | Time (ms) | Force (gr) |
|---|---|---|---|---|---|
| Reference (conventional design) | 6.37 | 43.7 | 80 | 6 | 11 |
| 160W3 | 7.10 | 41.8 | 30 | 6 | 12 |
| 160W3-1 | 6.79 | 40.0 | 30 | 6 | 12 |
| 160W3-2 | 7.41 | 41.1 | 30 | 6 | 12 |
| 160W3-3 | 7.71 | 41.7 | 30 | 6 | 12 |
| 160W3-4 | 6.51 | 41.2 | 30 | 6 | 12 |
| 160W3-5 | 6.88 | 40.5 | 30 | 6 | 12 |

Table 3 is a compilation of data illustrating the superior pull resistance of bonds formed by bonding tools according to the present invention as compared to a conventional bonding tool.

TABLE 3

| Capillary | Pull X (gr) | Pull Y (gr) | Pull Avg. (gr) | USG (mA) | Time (ms) | Force (gr) |
|---|---|---|---|---|---|---|
| Reference (conventional design) | 7.15 | 7.08 | 7.11 | 65 | 5 | 120 |
| 160W3 | 7.24 | 7.04 | 7.14 | 35 | 6 | 100 |
| 160W3-1 | 7.00 | 7.12 | 7.06 | 35 | 6 | 100 |
| 160W3-2 | 7.33 | 7.23 | 7.28 | 35 | 6 | 100 |
| 160W3-3 | 7.81 | 7.36 | 7.58 | 35 | 6 | 100 |
| 160W3-4 | 7.15 | 7.25 | 7.20 | 35 | 6 | 100 |
| 160W3-5 | 7.28 | 7.16 | 7.22 | 35 | 6 | 100 |

Figure 8:
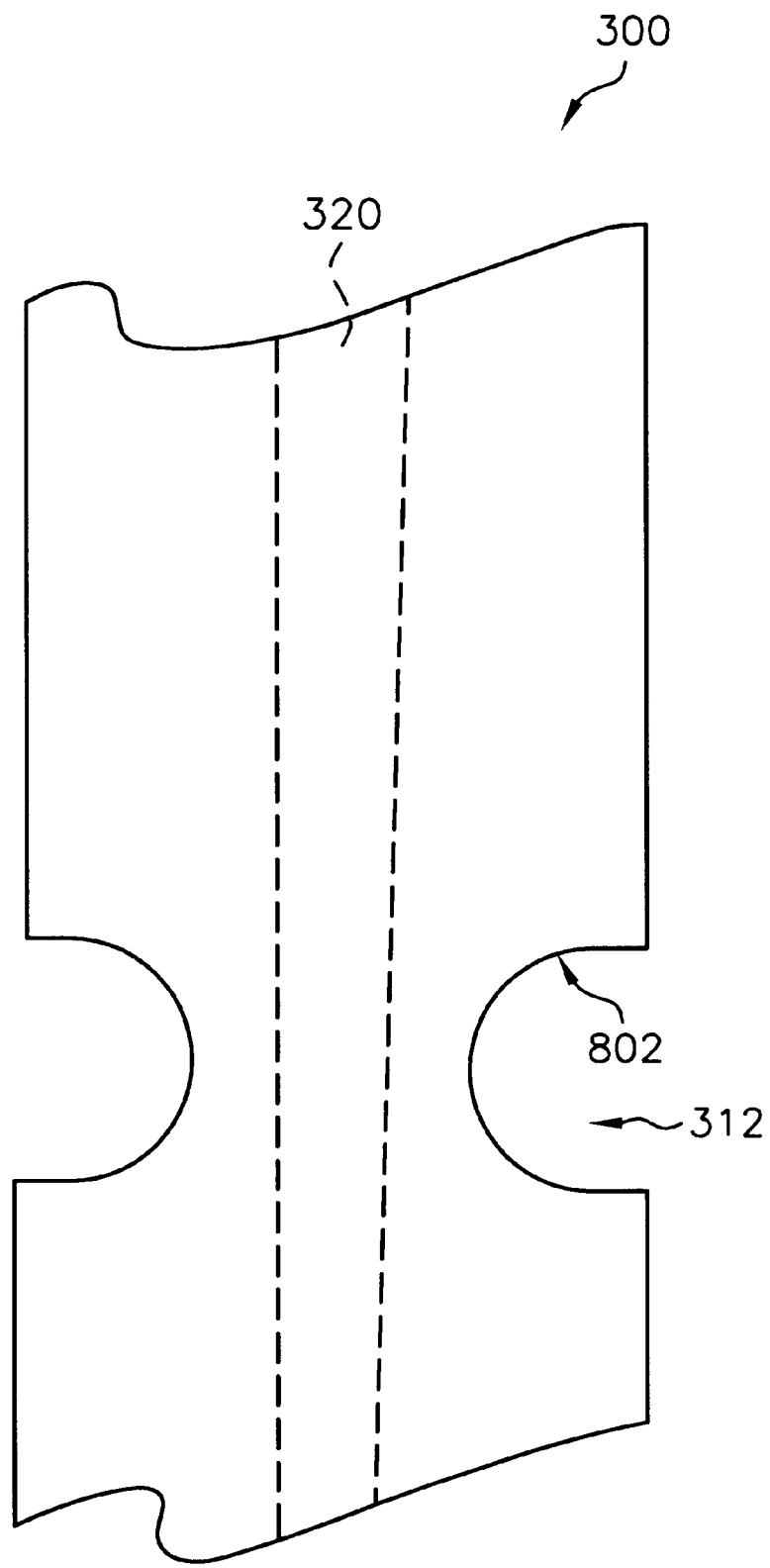
FIG. 8 is a partial side view of a bonding tool according to a second exemplary embodiment of the present invention.

FIG. 8, is a partial side view of a second exemplary embodiment of the present invention. In FIG. 8, groove 312 includes a curved profile 802. In all other aspects, the second exemplary embodiment is similar to the first exemplary embodiment.

Figure 9:
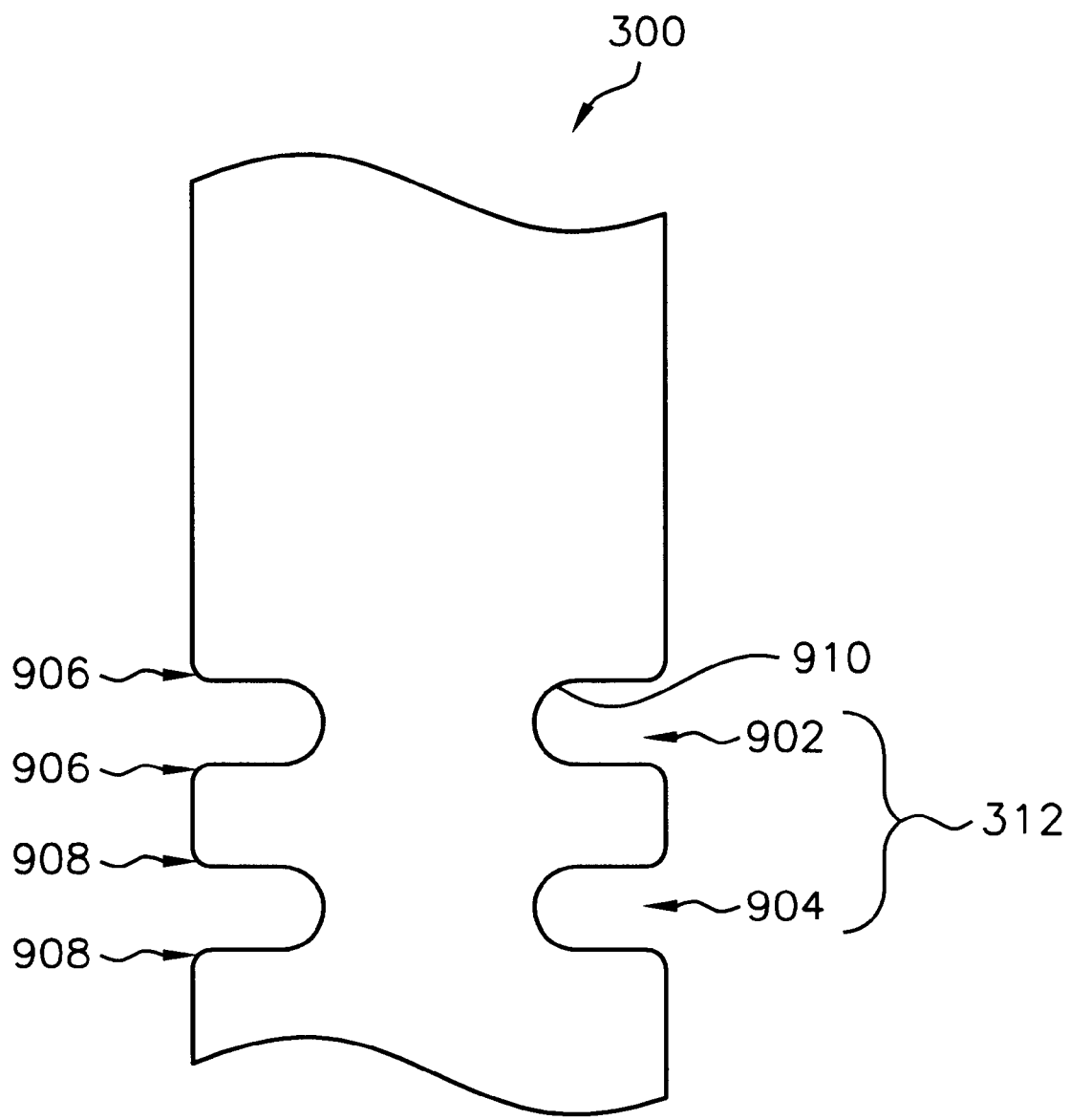
FIG. 9 is a partial side view of a bonding tool according to a third exemplary embodiment of the present invention.

FIG. 9, is a partial side view of a third exemplary embodiment of the present invention. In FIG. 9, groove 312 of bonding tool 300 includes two grooves 902, 904. Although two grooves are shown in FIG. 9, the invention is not so limited and may include more than two grooves if desired. In the exemplary embodiment each groove has a curved portion 910. As discussed above, with respect to the first exemplary embodiment, the profile of the grooves 902, 904 depends on the process used to form the groove and need not include a curved portion. In FIG. 9, edges 906, 908 may be chamfered or rounded, if desired, to remove sharp edges that result from formation of grooves 902, 904. In all other aspects, the third exemplary embodiment is similar to the first exemplary embodiment.

FIGS. 10A and 10B, are a partial side view and plan view, respectively of a fourth exemplary embodiment of the present invention. In FIG. 10, slots 1000 replace groove 312 of bonding tool 300. The width 1002, length 1004, depth 1006 and number of slots 1000 are based on the desired response of the bonding tool 300. The slots may be substantially parallel to the longitudinal axis of the bonding tool or may be placed in the body of the bonding tool 300 at a predetermined angle as shown in FIG. 10C. In all other aspects, the fourth exemplary embodiment is similar to the first exemplary embodiment.

Figure 11:
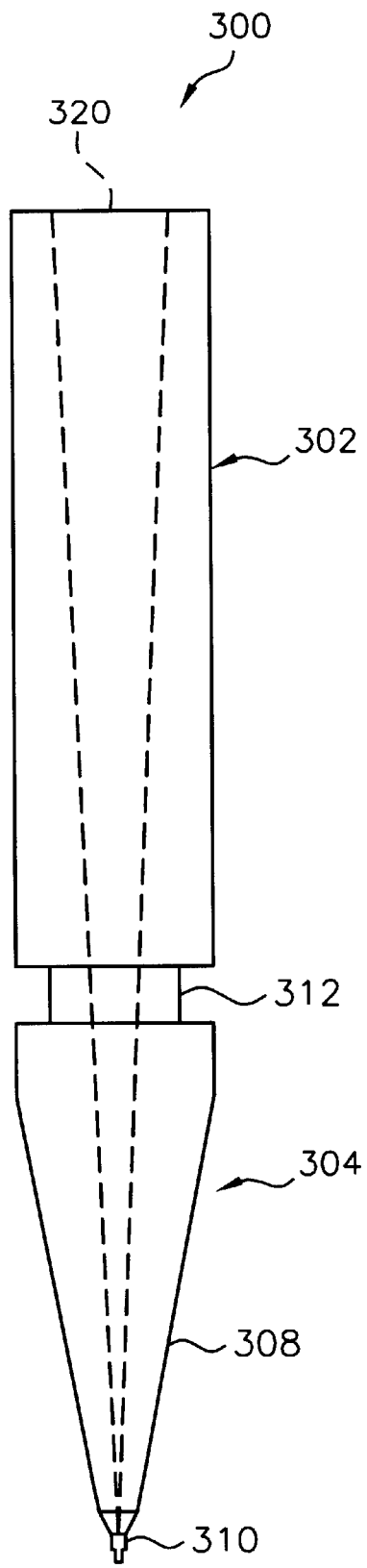
FIG. 11 is a partial side view of a bonding tool according to a fifth exemplary embodiment of the present invention.

FIG. 11, is a side view of a fifth exemplary embodiment of the present invention. In FIG. 11, tapered section 308 is

What is claimed:

1. A bonding tool for use with an ultrasonic transducer to bond a fine wire to a substrate, the bonding tool comprising:
   a first cylindrical section having a first diameter, a first end of the first cylindrical section coupled to the transducer;
   a second cylindrical section coupled to a second end of the first cylindrical section, the second cylindrical section having a second diameter less than the first diameter; and
   a tapered section coupled to an end of the second cylindrical section.

2. The bonding tool according to claim 1, wherein the tapered section has a third diameter at a first end thereof, the third diameter substantially equal to the first diameter of the first cylindrical section.

3. The bonding tool according to claim 1, further comprising an axial passage extending along a longitudinal axis of the bonding tool from a first end of the boning tool to a second end of the bonding tool.

4. The bonding tool according to claim 3, wherein the axial passage has a first diameter at a first end of the first cylindrical section and a second diameter a tip of the tapered section, the first diameter greater than the second diameter.

5. The bonding tool according to claim 1, wherein the bonding tool is formed from at least one of the group consisting of aluminum oxide, tungsten carbide, ruby, ceramic and zircon.

6. A bonding tool for bonding a fine wire to a substrate, the bonding tool comprising:
   a first cylindrical section having a first diameter;
   a tapered section coupled to an end of the first cylindrical section; and
   a circumferential groove disposed between the first cylindrical section and the tapered section.

7. The bonding tool according to claim 6, wherein the groove is disposed at a node of the bonding tool.

8. The bonding tool according to claim 6, wherein the groove is disposed at a predetermined distance from an end of the tapered section.

9. The bonding tool according to claim 8, wherein the distance is between about 0.1400 and 0.1833 inches (3.556 and 4.656 mm).

10. The bonding tool according to claim 8, wherein the distance is between about 0.1400 and 0.1430 inches (3.556 and 3.632 mm).

11. The bonding tool according to claim 6, wherein the groove has a predetermined width.

12. The bonding tool according to claim 11, wherein the width is between about 0.0136 and 0.0200 inches (0.345 and 0.508 mm).

13. The bonding tool according to claim 11, wherein the width is between about 0.0160 and 0.0190 inches (0.406 and 0.483 mm).

14. The bonding tool according to claim 6, wherein the groove has a predetermined diameter less than the first diameter of the cylindrical section.

15. The bonding tool according to claim 14, wherein the diameter is between about 0.0082 and 0.0156 inches (0.208 and 0.396 mm).

16. The bonding tool according to claim 14, wherein the diameter is between about 0.0154 and 0.0160 inches (0.39 and 0.406 mm).

17. A capillary bonding tool use with an ultrasonic transducer, the bonding tool comprising:
   a first cylindrical section having a first diameter, a first end and a second end, the first end of the first cylindrical section coupled to the transducer;
   a second cylindrical section coupled to the second end of the first cylindrical section, the second cylindrical section having a second diameter less than the first diameter;
   a tapered section having a first end coupled to an end of the second cylindrical section and a second end, the first end of the tapered section having a third diameter substantially equal to the first diameter of the first cylindrical section, and the second end having a fourth diameter less than the third diameter; and
   an axial passage extending from the first end of first cylindrical section to the second end of the tapered section.

18. The capillary bonding tool according to claim 17, wherein the axial passage has a conical shape.

19. The capillary bonding tool according to claim 17, wherein the axial passage has a substantially constant diameter.

20. The capillary bonding tool according to claim 19, wherein the axial passage has a taper disposed at the first end of the first cylindrical section.

21. A bonding tool for bonding a fine wire to a substrate, the bonding tool comprising:
   a first cylindrical section having a first diameter;
   a tapered section couple to an end of the first cylindrical section; and
   a circumferential orifice disposed between the first cylindrical section and the tapered section.

22. The bonding tool according to claim 21, wherein the orifice is at least one groove.

23. The bonding tool according to claim 22, wherein the groove has a substantially rectangular cross section.

24. The bonding tool according to claim 23, wherein the groove has a radius along at least a portion of the cross section.

25. The bonding tool according to claim 21, wherein the orifice is a plurality of grooves.

26. The bonding tool according to claim 21, wherein the orifice is a slot.

27. A bonding tool for bonding a fine wire to a substrate, the bonding tool comprising:
   a first cylindrical section having a first diameter;
   a tapered section coupled to an end of the first cylindrical section; and
   a plurality of slots disposed between the first cylindrical section and the tapered section along a circumference of the bonding tool.

28. The bonding tool according to claim 26, wherein the slot has a longitudinal axis substantially parallel to a longitudinal axis of the bonding tool.

29. A bonding tool for bonding a fine wire to a substrate, the bonding tool comprising:

a first cylindrical section having a first diameter;

a tapered section coupled to an end of the first cylindrical section; and a slot disposed between the first cylindrical section and the tapered section, wherein the slot has a longitudinal axis offset from a longitudinal axis of the bonding tool by a predetermined angle.

30. A bonding tool for bonding a fine wire to a substrate, the bonding tool comprising:

a first cylindrical section having a first diameter, the first end of the first cylindrical section coupled to the transducer;

a second cylindrical section coupled to an end of the first cylindrical section, the second cylindrical section having a second diameter less than the first diameter;

a third cylindrical section having the first diameter, the third cylindrical section coupled to an end of the second cylindrical section; and a tapered section coupled to an end of the third cylindrical section.

* * * * *

UNITED STATES PATENT AND TRADEMARK OFFICE
CERTIFICATE OF CORRECTION

PATENT NO.     : 6,321,969 B1
DATED          : November 27, 2001
INVENTOR(S)    : Amir Miller It is certified that error appears in the above-identified patent and that said Letters Patent is hereby corrected as shown below:

Title page,
Item [56], References Cited, U.S. PATENT DOCUMENTS, insert:
-- 4,020,543    5/1977    Pennings --
FOREIGN PATENT DOCUMENTS, insert:
-- European                      0 622 149 A1           11/02/94
   Japan (Abstract Only)         53045172               4/22/78
After FOREIGN PATENT DOCUMENTS, insert:
-- OTHER PUBLICATIONS
PCT International Search Report; International Application No. PCT/US01/13635, dated 7/23/01 --

Column 3,
Line 8, delete "is a"
Line 11, delete "is a is a"

Column 4,
Line 13, at the end of the line, insert -- m -- before the parentheses
Line 42, delete "be"

Column 7,
Line 27, delete "boning" and insert -- bonding --.

Column 8,
Line 10, delete "use" and insert -- used --.
Line 39, delete "couple" and insert -- coupled --

Signed and Sealed this

Fifth Day of August, 2003

JAMES E. ROGAN
*Director of the United States Patent and Trademark Office*